US012626763B2

(12) United States Patent
Song

(10) Patent No.: US 12,626,763 B2
(45) Date of Patent: May 12, 2026

(54) THREE-DIMENSIONAL FLASH MEMORY INCLUDING FLOATING DEVICES, AND MANUFACTURING METHOD THEREFOR

(71) Applicant: IUCF-HYU (Industry University Cooperation Foundation Hanyang University), Seoul (KR)

(72) Inventor: Yun Heub Song, Seoul (KR)

(73) Assignee: IUCF-HYU (Industry University Cooperation Foundation Hanyang University), Seoul (KR)

( * ) Notice: Subject to any disclaimer, the term of this patent is extended or adjusted under 35 U.S.C. 154(b) by 421 days.

(21) Appl. No.: 18/264,171

(22) PCT Filed: Nov. 26, 2021

(86) PCT No.: PCT/KR2021/017624
§ 371 (c)(1),
(2) Date: Aug. 3, 2023

(87) PCT Pub. No.: WO2022/177109
PCT Pub. Date: Aug. 25, 2022

(65) Prior Publication Data
US 2024/0096414 A1      Mar. 21, 2024

(30) Foreign Application Priority Data

Feb. 17, 2021      (KR) ........................ 10-2021-0021345

(51) Int. Cl.
*G11C 16/04*          (2006.01)
*H10B 41/27*          (2023.01)
*H10D 64/01*          (2025.01)

(52) U.S. Cl.
CPC ......... *G11C 16/0483* (2013.01); *H10B 41/27* (2023.02); *H10D 64/035* (2025.01); *H10D 64/037* (2025.01)

(58) Field of Classification Search
CPC . G11C 16/0483; G11C 11/5621; H10B 41/27; H10B 43/27; H10B 43/30;
(Continued)

(56) References Cited

U.S. PATENT DOCUMENTS

2014/0008714 A1*    1/2014  Makala ................. H10B 41/41
                                                    257/E27.06
2015/0008505 A1    1/2015  Chien et al.
(Continued)

FOREIGN PATENT DOCUMENTS

KR      10-2013-0123165      11/2013
KR      10-2016-0056243      5/2016
(Continued)

OTHER PUBLICATIONS

International Search Report mailed Mar. 7, 2022, issued in corresponding International Application No. PCT/KR2021/017624, filed Nov. 26, 2021, 5 pages.

*Primary Examiner* — Jessica S Manno
*Assistant Examiner* — Bipana Adhikari Dawadi
(74) *Attorney, Agent, or Firm* — CHRISTENSEN O'CONNOR JOHNSON KINDNESS PLLC

(57)          ABSTRACT

A three-dimensional flash memory including floating devices and a manufacturing method therefor are disclosed. A method for manufacturing a three-dimensional flash memory according to an embodiment may comprise the steps of: preparing a semiconductor structure including a plurality of word lines and a plurality of interlayer insulating layers, which are alternately stacked in a vertical direction while extending in a horizontal direction, respectively, and at least one memory cell string formed extending through the plurality of word lines and the plurality of interlayer insulating layers in the vertical direction, wherein the at least one memory cell string constitutes a plurality of memory cells corresponding to the plurality of word lines, while
(Continued)

including a channel layer formed extending in the vertical direction, a charge storage layer formed to surround the channel layer, and a floating device layer formed extending to surround the charge storage layer; removing the plurality of interlayer insulating layers from the semiconductor structure; and removing regions of the floating device layer corresponding to the plurality of interlayer insulating layers, in order to form a plurality of floating devices isolated from each other.

5 Claims, 8 Drawing Sheets

(58) Field of Classification Search
CPC ...... H10B 51/20; H10B 51/30; H10D 64/035; H10D 64/037; H10D 30/0413; H10D 30/0415
See application file for complete search history.

(56) References Cited

U.S. PATENT DOCUMENTS

| | | |
|---|---|---|
| 2016/0163725 A1 | 6/2016 | Kamiya et al. |
| 2017/0069647 A1 | 3/2017 | Ohashi et al. |

FOREIGN PATENT DOCUMENTS

| | | |
|---|---|---|
| KR | 10-2020-0007609 | 1/2020 |
| KR | 10-2020-0092576 | 8/2020 |
| KR | 10-2020-0132561 | 11/2020 |

* cited by examiner

THREE-DIMENSIONAL FLASH MEMORY INCLUDING FLOATING DEVICES, AND MANUFACTURING METHOD THEREFOR

CROSS-REFERENCE TO RELATED APPLICATIONS

This application is a National Stage of International Application No. PCT/KR2021/017624, filed Nov. 26, 2021, which claims the benefit of Korean Application No. 10-2021-0021345, filed Feb. 17, 2021, the disclosures of which are hereby incorporated by reference in their entirety.

TECHNICAL FIELD

The following example embodiments relate to a three-dimensional (3D) flash memory, and more particularly, to technology for a 3D flash memory including a floating device and a manufacturing method thereof.

RELATED ART

A flash memory device refers to an electrically erasable programmable read only memory (EEPROM) and the memory may be commonly used for, for example, a computer, a digital camera, an MP3 player, a game system, and a memory stick. The flash memory device electrically controls input and output of data through Fowler-Nordheim (F-N) tunneling or hot electron injection.

In detail, referring to FIG. 1 that illustrates an array of a conventional three-dimensional (3D) flash memory, the array of the 3D flash memory may include a common source line (CSL), a bit line (BL), and a plurality of cell strings (CSTRs) provided between the common source line (CSL) and the bit line (BL).

The bit lines are two-dimensionally arranged and the plurality of cell strings (CSTRs) are connected in parallel to each of the bit lines. The cell strings (CSTRs) may be commonly connected to the common source line (CSL). That is, the plurality of cell strings (CSTRs) may be provided between the plurality of bit lines and a single common source line (CSL). Here, a plurality of common source lines (CSLs) may be present and the plurality of common source lines (CSLs) may be two-dimensionally arranged. Here, the same voltage may be electrically applied to the plurality of common source lines (CSLs), or each of the plurality of common source lines (CSLs) may be electrically controlled.

Each of the cell strings (CSTRs) may include a ground selection transistor (GST) configured to connect to the common source line (CSL), a string selection transistor (SST) configured to connect to the bit line (BL), and a plurality of memory cell transistors (MCTs) provided between ground and string selection transistors (GST and SST). The ground selection transistor (GST), the string selection transistor (SST), and the memory cell transistors (MCT) may be connected in series.

The common source line (CSL) may be commonly connected to sources of the ground selection transistors (GSTs). In addition thereto, the ground selection line (GSL), the plurality of word lines (WL0-WL3), and the plurality of string selection lines (SSLs) provided between the common source line (CSL) and the bit line (BL) may be used as electrode layers of the ground selection transistor (GST), the memory cell transistors (MCTs), and the string selection transistors (SSTs), respectively. Also, each of the memory cell transistors (MCTs) includes a memory element.

Meanwhile, the conventional 3D flash memory increases degree of integration by vertically stacking cells to meet excellent performance and low prices requested by consumers.

For example, referring to FIG. 2 that illustrates a structure of a conventional 3D flash memory, the conventional 3D flash memory is manufactured by providing an electrode structure 215 in which interlayer insulating layers 211 and horizontal structures 250 are alternately and repeatedly formed on a substrate 200. The interlayer insulating layers 211 and the horizontal structures 250 may extend in a first direction. The interlayer insulating layers 211 may be, for example, silicon oxide films and, among the interlayer insulating layers 211, a bottom interlayer insulating layer 211a may have a thickness less than those of the remaining interlayer insulating layers 211. Each of the horizontal structures 250 may include first and second blocking insulating films 242 and 243 and an electrode layer 245. A plurality of electrode structures 215 may be provided and the plurality of electrode structures 215 may be provided to face each other in a second direction that crosses the first direction. The first direction and the second direction may correspond to the x-axis and the y-axis of FIG. 2, respectively. Trenches 240 configured to isolate the plurality of electrode structures 215 from each other may extend in the first direction between the plurality of electrode structures 215. Highly doped impurity regions may be formed in the substrate 200 exposed by the trenches 240 and the common source line (CSL) may be provided. Although not illustrated, separation insulating films that fill the trenches 240 may be further provided.

Vertical structures 230 that pass through the electrode structure 215 may be provided. For example, the vertical structures 230 may be aligned in a matrix form along the first direction and the section direction from a planar perspective. As another example, the vertical structures 230 may be aligned in the second direction and may be provided in a zigzagged shape in the first direction. Each of the vertical structures 230 may include a passivation film 224, a charge storage film 225, a tunnel insulating film 226, and a channel layer 227. For example, the channel layer 227 may be provided in a hollow tube shape. In this case, a filling film 228 that fills inside of the channel layer 227 may be further provided. A drain region D may be provided in an upper portion of the channel layer 227 and a conductive pattern 229 may be formed on the drain region D and connected to the bit line (BL). The bit line (BL) may extend in a direction that crosses the horizontal electrodes 250, for example, the second direction. For example, the vertical structures 230 aligned in the second direction may be connected to a single bit line (BL).

The first and second blocking insulating films 242 and 243 included in the horizontal structures 250 and the charge storage film 225 and the tunnel insulating film 226 included in the vertical structures 230 may be defined as an oxide-nitride-oxide (ONO) layer that is an information storage element of the 3D flash memory. That is, some of information storage elements may be included in the vertical structures 230 and remaining thereof may be included in the horizontal structures 250. For example, among the information storage elements, the charge storage film 225 and the tunnel insulating film 226 may be included in the vertical structures 230 and the first and second blocking insulating films 242 and 243 may be included in the horizontal structures 250. However, without being limited thereto or restricted thereby, the charge storage film 225 and the tunnel insulating film 226 defined as the ONO layer may be implemented to be included in the vertical structures 230 only.

Epitaxial patterns 222 may be provided between the substrate 200 and the vertical structures 230. The epitaxial patterns 222 connect the substrate 200 and the vertical structures 230. The epitaxial patterns 222 may be in contact with at least one layer of the horizontal structures 250. That is, the epitaxial patterns 222 may be provided to be in contact with a bottom horizontal structure 250a. According to another example embodiment, the epitaxial patterns 222 may be provided to be in contact with a plurality of layers, for example, two layers of the horizontal structures 250. Meanwhile, when the epitaxial patterns 222 are provided to be in contact with the bottom horizontal structure 250a, the bottom horizontal structure 250a may be provided to be thicker than the remaining horizontal structures 250. The bottom horizontal structure 250a in contact with the epitaxial patterns 222 may corresponding to the ground selection line (GSL) of the array of the 3D flash memory described above with reference to FIG. 1 and the remaining horizontal structures 250 in contact with the vertical structures 230 may correspond to the plurality of word lines (WL0-WL3).

Each of the epitaxial patterns 222 has a recessed sidewall 222a. Therefore, the bottom horizontal structure 250a in contact with the epitaxial patterns 222 is provided along a profile of the recessed sidewall 222a. That is, the bottom horizontal structure 250a may be provided in an inwardly convex shape along the recessed sidewall 222a of the epitaxial patterns 222.

Meanwhile, for multi-level implementation and reliability improvement for the 3D flash memory, a structure that includes floating devices is currently proposed. However, the existing structure that includes floating devices has a disadvantage in that vertical scaling is very difficult since blocking oxide and polycrystalline silicon (poly-silicon) need to be provided within a flattened "C"-shaped structure that surrounds the floating devices.

Therefore, there is a need for technology for easily implementing vertical scaling in a structure that includes floating devices.

DETAILED DESCRIPTION

Technical Subject

Example embodiments provide a three-dimensional (3D) flash memory having a simplified structure to facilitate vertical scaling while including floating devices and a manufacturing method thereof.

Technical Solution

According to an example embodiment, there is provided a method of manufacturing a three-dimensional (3D) flash memory including a floating device, the method including preparing a semiconductor structure including a plurality of word lines and a plurality of interlayer insulating layers that are alternately stacked in a vertical direction while each extending in a horizontal direction, at least one memory cell string that is formed extending by passing through the plurality of word lines and the plurality of interlayer insulating layers in the vertical direction, the at least one memory cell string constituting a plurality of memory cells corresponding to the plurality of word lines while including a channel layer formed extending in the vertical direction, a charge storage layer formed to surround the channel layer, and a floating device layer formed extending to surround the charge storage layer; removing the plurality of interlayer insulating layers from the semiconductor structure; and removing regions corresponding to the plurality of interlayer insulating layers in the floating device layer to form a plurality of floating devices isolated from each other.

According to an aspect, the removing the regions corresponding to the plurality of interlayer insulating layers in the floating device layer may include removing the regions corresponding to the plurality of interlayer insulating layers in the floating device layer through a plurality of air gaps that are spaces in which the plurality of interlayer insulating layers are removed.

According to another aspect, the removing the regions corresponding to the plurality of interlayer insulating layers in the floating device layer may include removing the regions corresponding to the plurality of interlayer insulating layers in the floating device layer using a thermal oxidation process.

According to still another aspect, the removing the plurality of interlayer insulating layers and the removing the regions corresponding to the plurality of interlayer insulating layers in the floating device layer may be performed through a single process.

According to still another aspect, the manufacturing method of the 3D flash memory may further include forming a floating gate oxide layer in spaces in which regions corresponding to the plurality of interlayer insulating layers are removed in the floating device layer to isolate the plurality of memory cells from each other.

Effect

According to example embodiments, it is possible to provide a three-dimensional (3D) flash memory having a simplified structure to facilitate vertical scaling while including floating devices and a manufacturing method thereof.

BEST MODE

Figure 1:
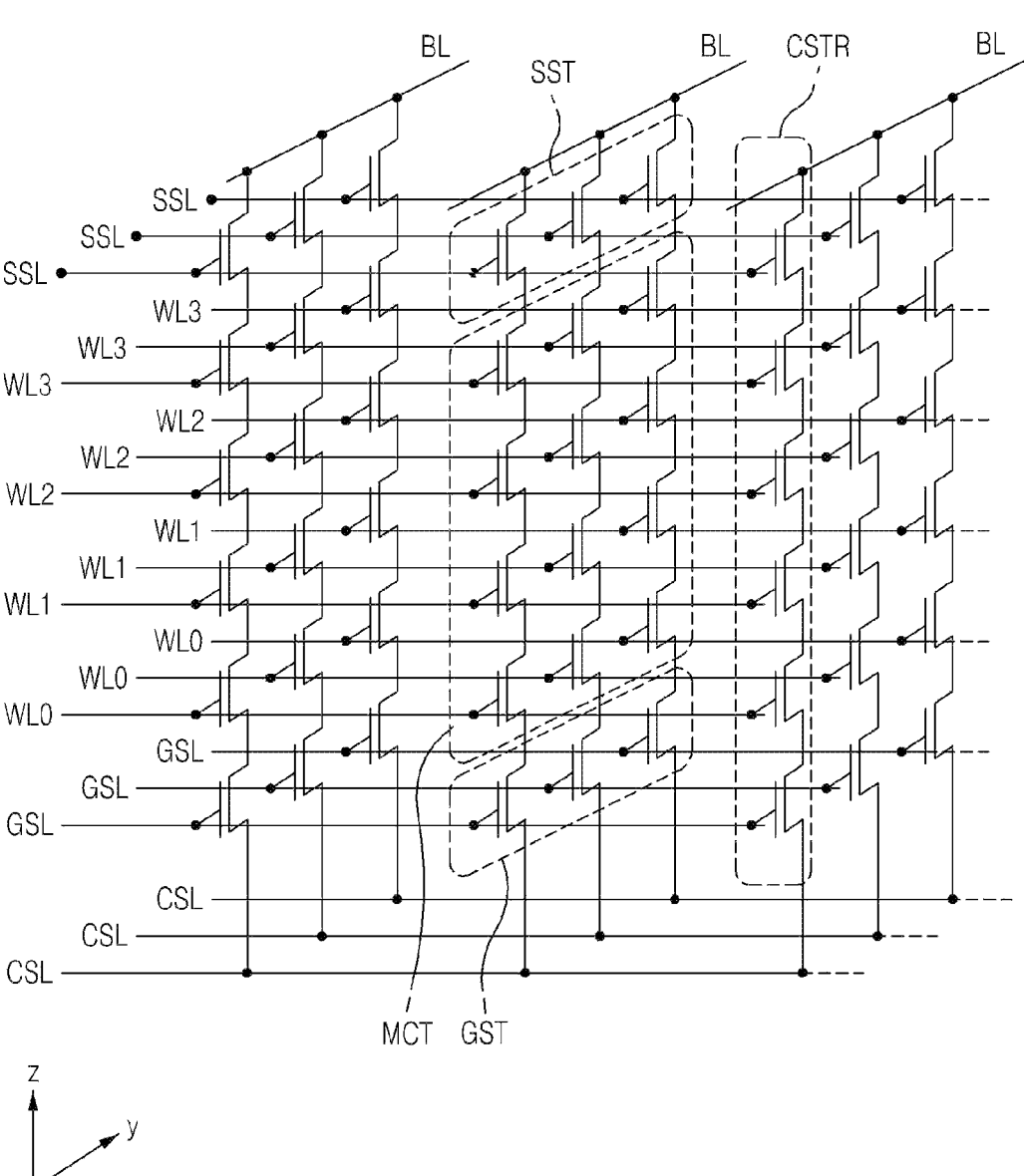
FIG. 1 is a simplified circuitry diagram illustrating a conventional three-dimensional (3D) flash memory.

Hereinafter, example embodiments of the present invention are described with reference to the accompanying drawings. However, the present invention is not limited to or restricted by the example embodiments. Also, like reference numerals proposed in the respective drawings refer to like elements throughout.

Also, terms (terminology) used herein are terms used to appropriately express example embodiments of the present invention and may vary according to the intention of a viewer or an operator, or customs of field to which the present invention pertains. Therefore, the terms need to be defined based on the overall contents. For example, as used herein, the singular forms "a," "an," and "the," are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, and elements.

Also, it should be understood that various example embodiments of the present invention are different from each other, but are not necessarily mutually exclusive. For example, a specific shape, structure, and characteristic described herein may be implemented in another example embodiment without departing from technical spirit and scope of the present invention. Also, it should be understood that a location, an arrangement, or a configuration of an individual component may be modified without departing from technical spirit and scope of the present invention.

Figure 2:
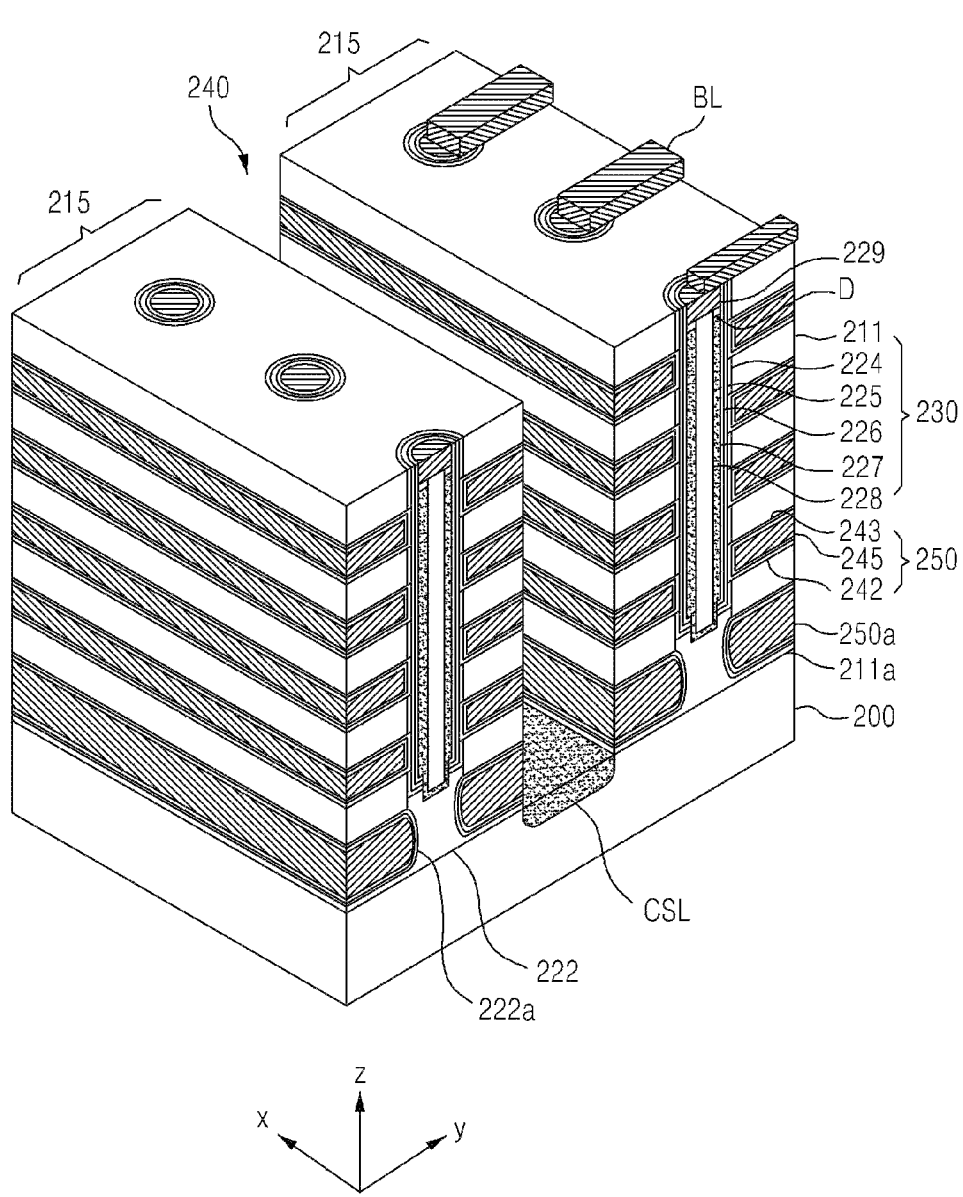
FIG. 2 is a perspective view illustrating a structure of a conventional 3D flash memory.

Hereinafter, for clarity of description, in a side cross-sectional view illustrating a 3D flash memory, the 3D flash memory may be illustrated and described without a component, such as a source line located below a plurality of memory cell strings and the like. However, the following 3D flash memory is not limited thereto or restricted thereby and may further include an additional component based on a structure of the conventional 3D flash memory of FIG. 2.

Figure 3:
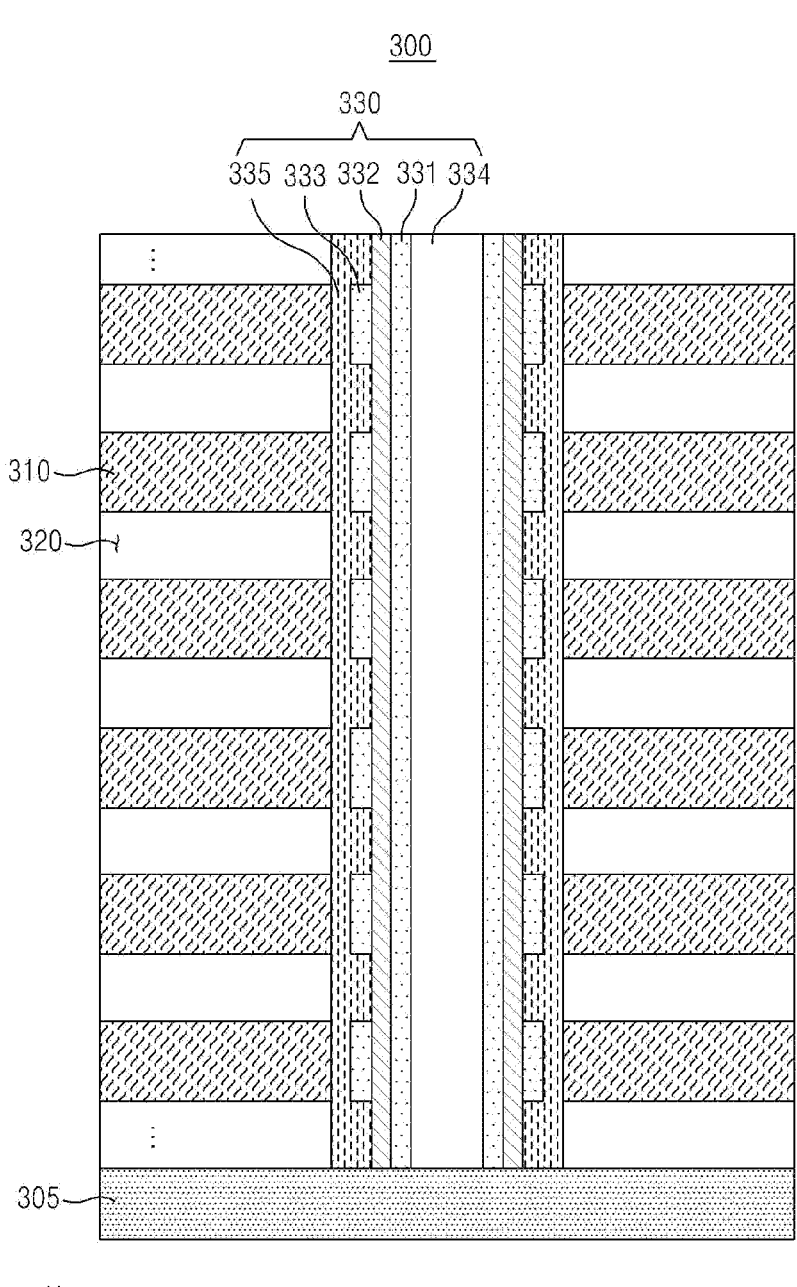
FIG. 3 is a side cross-sectional view illustrating a 3D flash memory according to an example embodiment.
Figure 3:
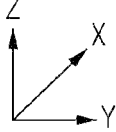

FIG. 3 is a side cross-sectional view illustrating a 3D flash memory according to an example embodiment.

Referring to FIG. 3, a 3D flash memory 300 according to an example embodiment includes a plurality of word lines 310, a plurality of air gaps 320, and at least one memory cell string 330.

The plurality of word lines 310 are sequentially stacked in a vertical direction while extending in a horizontal direction on a substrate 305. Each of the plurality of word lines 310 may be formed of a conductive material, such as tungsten (W), titanium (T), tantalum (Ta), copper (Cu), molybdenum (Mo), ruthenium (Ru), and gold (Au), (including all metal materials capable of making ALD formation in addition to the aforementioned metal materials), and may perform a memory operation (a read operation, a program operation, and an erase operation) by applying a voltage to respectively corresponding memory cells.

A string selection line (SSL) may be provided above the plurality of word lines 310 and a ground selection line (GSL) may be provided below the plurality of word lines 310.

The plurality of air gaps 320 may extend in a horizontal direction between the plurality of word lines 310 and may be maintained in a vacuum state or may maintain a state in which normal air or predetermined gas is injected. As such, the state maintained by the plurality of air gaps 320 may be variously implemented in various manners on the premise that insulation between the plurality of word lines 310 is possible.

Therefore, the plurality of word lines 310 and the plurality of air gaps 320 may be alternately stacked in a vertical direction.

The at least one memory cell string 330 is formed extending in the vertical direction on the substrate 305 by passing through the plurality of word lines 310 and the plurality of air gaps 320 and may constitute a plurality of memory cells corresponding to the plurality of word lines 310 (the plurality of memory cells corresponding to a plurality of floating devices 333) by each including a channel layer 331, a charge storage layer 332, and the plurality of floating devices 333.

The channel layer 331 may extend in the vertical direction, may be formed of single crystal silicon or polycrystalline silicon (poly-silicon), and may transport charges or holes to the charge storage layer 332 by voltage applied through the plurality of word lines 310, the SSL, the GSL, and a bit line. Since the channel layer 331 is configured in a shape of macaroni having an empty inside, an oxide filling film 334 may be included in the channel layer 331.

The charge storage layer 332 may be a component formed extending to surround the channel layer 331 and configured to trap charges or holes by voltage applied through the plurality of word lines 310 or to maintain a state of charges (e.g., a polarization state of charges), and may be divided into regions corresponding to the plurality of word lines 310, may constitute the plurality of memory cells with the channel layer 331, and accordingly may serve as a data storage in the 3D flash memory 300. For example, an ONO layer or a ferroelectric layer may be used for the charge storage layer 332. The charge storage layer 332 is not limited to or restricted by extending to surround the channel layer 331 and may have a structure separated for each memory cell, while surrounding the channel layer 331.

The plurality of floating devices 333 may be provided spaced apart from each other while surrounding the charge storage layer 332 and may be formed of polycrystalline silicon. That is, each of the plurality of floating devices 333 may be formed in a tube shape and may include the charge storage layer 332 and the channel layer 331 therein.

In particular, the floating devices 333 in such a structure may be formed by removing some regions from an integrated floating device layer that is formed extending in the vertical direction, such as the channel layer 331 and the charge storage layer 332. As such, since the plurality of floating devices 333 are formed through a simplified removal process, the 3D flash memory 300 may have a simplified structure despite including the floating device and may easily perform vertical scaling accordingly.

Here, removal of some regions from the integrated floating device layer to form the plurality of floating devices 333 may be performed through the plurality of air gaps 320 and a thermal oxidation process may be used as a removal method.

Also, the at least one memory cell string 330 may further include a floating gate oxide layer 335 to separate the plurality of memory cells from each other.

Hereinafter, a method of manufacturing a 3D flash memory that includes a floating device having a simplified structure based on a simplified removal process is described.

Figure 4:
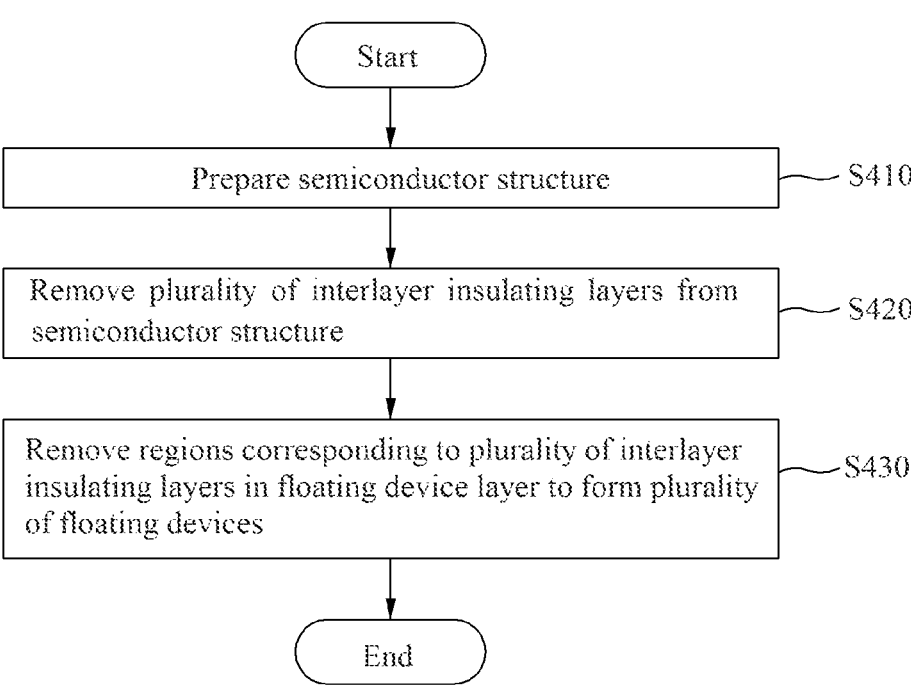
FIG. 4 is a flowchart illustrating a manufacturing method of a 3D flash memory according to an example embodiment.

FIG. 4 is a flowchart illustrating a manufacturing method of a 3D flash memory according to an example embodiment, and FIGS. 5A to 5D are side cross-sectional views illustrating a 3D flash memory to describe the manufacturing method of FIG. 4.

The following manufacturing method is premised on being performed by an automated and mechanized manufacturing system and a 3D flash memory manufactured through the manufacturing method may have a structure described above with reference to FIG. 3.

Figure 5A:
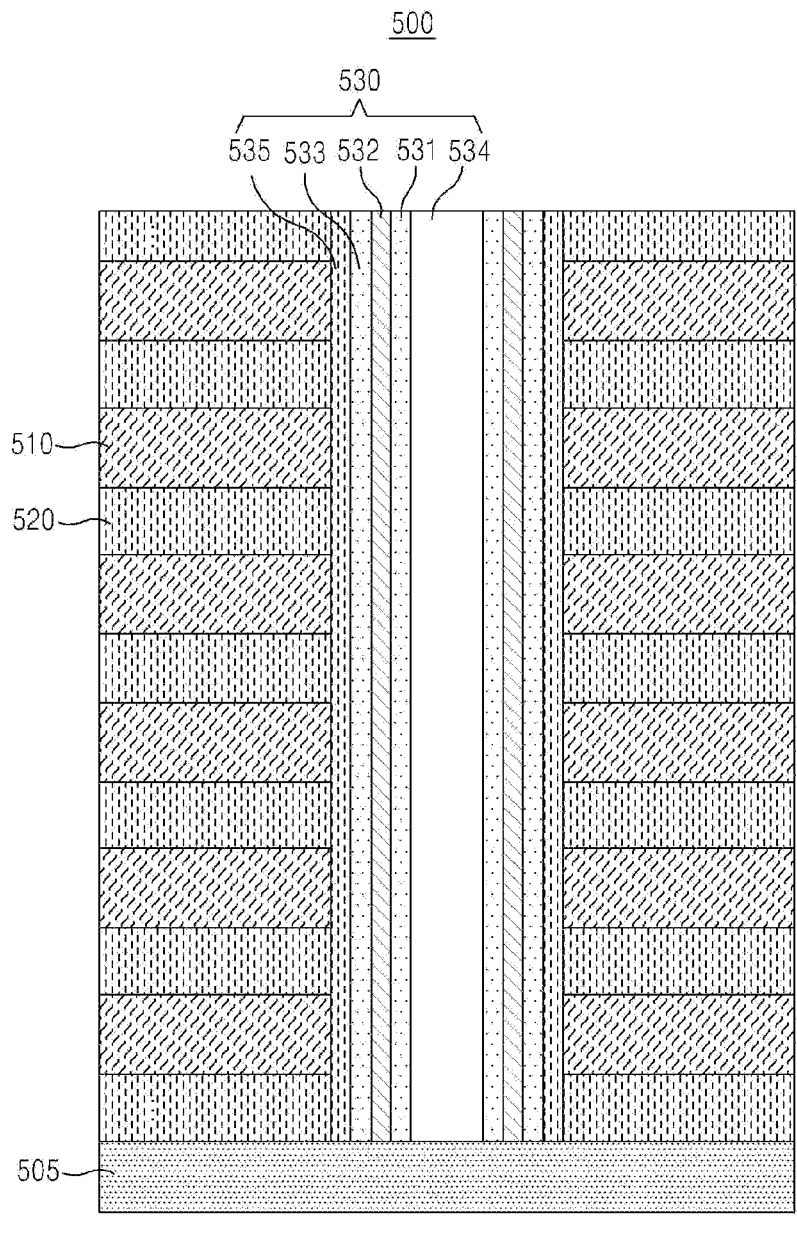
FIGS. 5A to 5D are side cross-sectional views illustrating a 3D flash memory to describe the manufacturing method of FIG. 4.

Referring to FIG. 4, in operation S410, a manufacturing system according to an example embodiment may prepare a semiconductor structure 500 as illustrated in FIG. 5A.

Here, the semiconductor structure 500 may include a plurality of word lines 510 and a plurality of interlayer insulating layers 520 that are alternately stacked in a vertical direction while each extending in a horizontal direction on a substrate 505 and at least one memory cell string 530 that is formed extending by passing through the plurality of word lines 510 and the plurality of interlayer insulating layers 520 in the vertical direction. The at least one memory cell string 530 may include a channel layer 531 formed extending in the vertical direction, a charge storage layer 532 formed extending to surround the channel layer 531, and a floating device layer 533 formed extending to surround the charge storage layer 532. Also, the at least one memory cell string 530 may further include a filling film 534 inside the channel layer 531 and may further include a floating gate oxide layer 535 formed extending to surround the floating device layer 533.

Figure 5B:
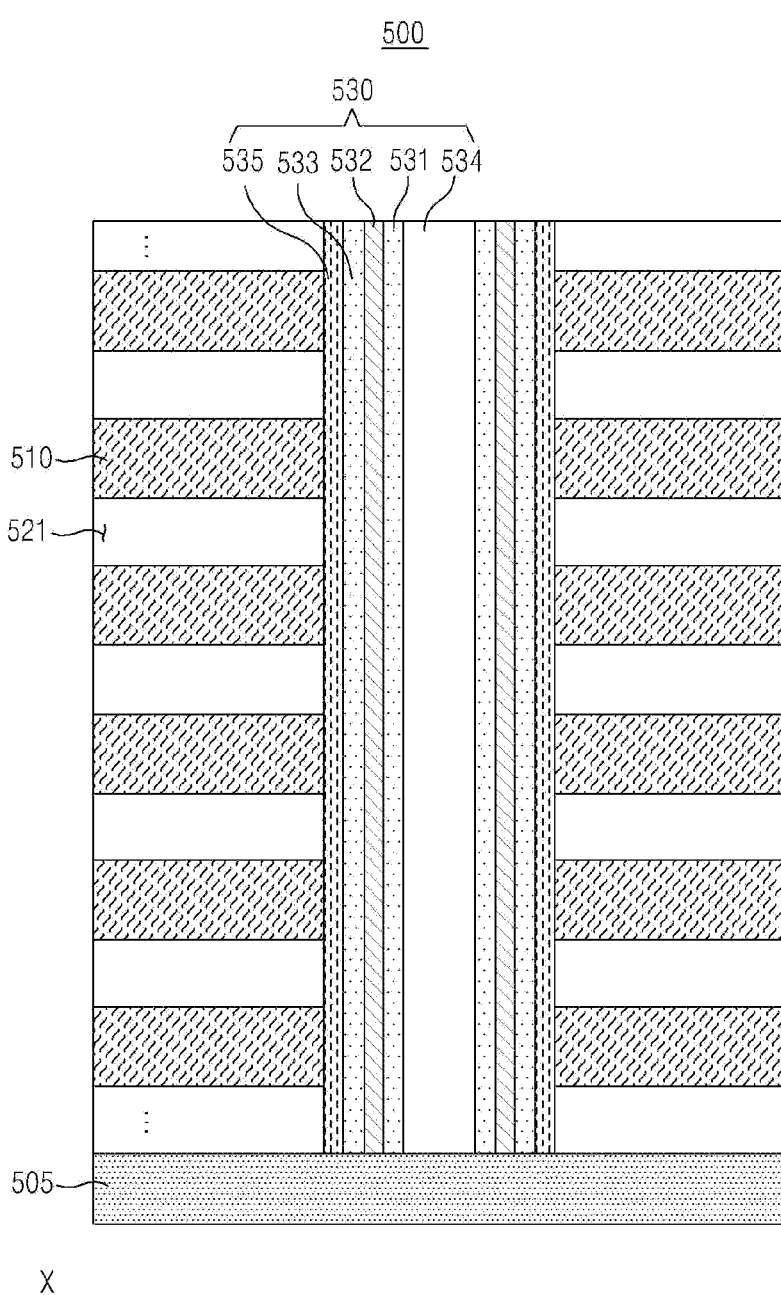
Figure 5B:
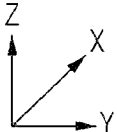

In operation S420, the manufacturing system may remove the plurality of interlayer insulating layers 520 from the semiconductor structure 500 as illustrated in FIG. 5B. Therefore, a plurality of air gaps 521 may be formed in spaces in which the plurality of interlayer insulating layers 520 are removed.

Figure 5C:
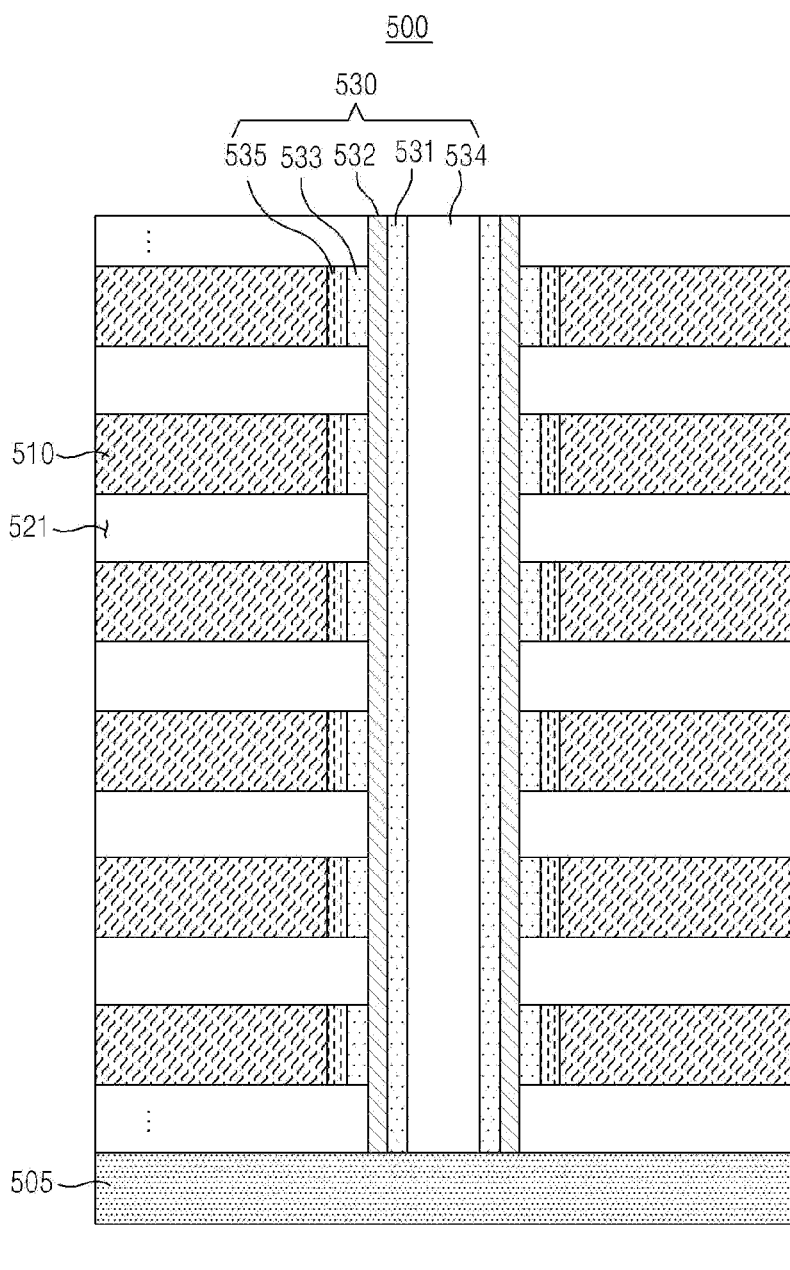
Figure 5C:
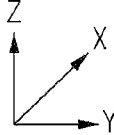

In operation S430, the manufacturing system may remove regions corresponding to the plurality of interlayer insulating layers 520 (regions corresponding to the plurality of air gaps 521) in the floating device layer 533 to form a plurality of floating devices 540 isolated from each other, as illustrated in FIG. 5C. In detail, the manufacturing system may form the plurality of floating devices 540 by removing regions corresponding to the plurality of air gaps 521 in the floating device layer 533 through the plurality of air gaps 521 that are spaces in which the plurality of interlayer insulating layers 520 are removed.

Here, the manufacturing system may use a thermal oxidation process as a method of removing regions corresponding to the plurality of air gaps 521 in the floating device layer 533.

Although operations S420 and S430 are described as separate operations, operations S420 and S430 may be performed as one operation that is performed through a single removal process without being limited thereto or restricted thereby. For example, the manufacturing system may remove the plurality of interlayer insulating layers 520 from the semiconductor structure 500 through the single removal process and, at the same time, may also remove regions corresponding to the plurality of interlayer insulating layers 520 (regions corresponding to the plurality of air gaps 521) in the floating device layer 533.

In the semiconductor structure 500, some regions of the floating gate oxide layer 535 included in the at least one memory cell string 530 may be removed together as some regions in the floating device layer 533 are removed in operation S430. Therefore, some regions removed in the floating gate oxide layer 535 need to be restored again to isolate the plurality of memory cells formed by regions corresponding to the plurality of word lines 510 in the at least one memory cell string 530 from each other.

Figure 5D:
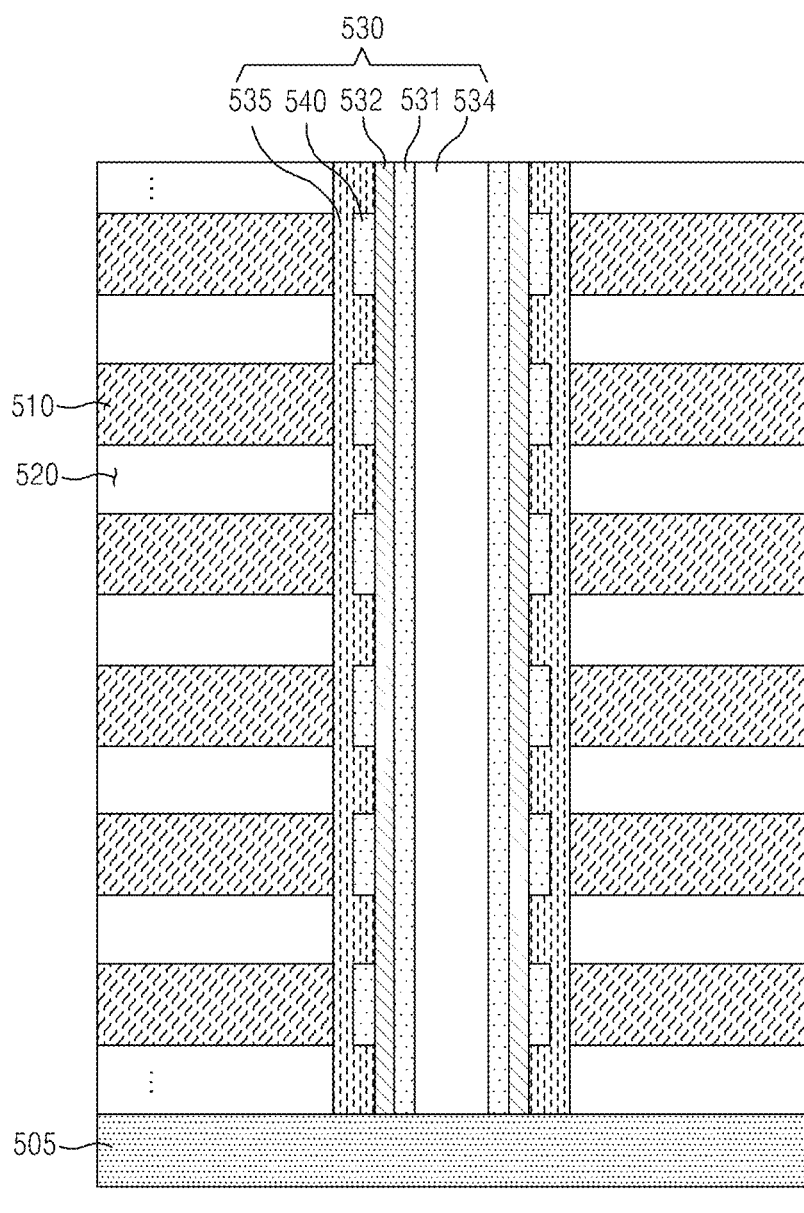
Figure 5D:
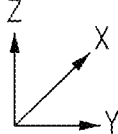

To this end, although it is not illustrated as a separate operation, the manufacturing system may form an additional floating gate oxide layer 550 in spaces in which regions corresponding to the plurality of interlayer insulating layers 520 (regions corresponding to the plurality of air gaps 521) are removed in the floating device layer 533 to isolate the plurality of memory cells formed by regions corresponding to the plurality of word lines 510 in the at least one memory cell string 530 from each other as illustrated in FIG. 5D.

Although example embodiments are described with reference to limited example embodiments and drawings, it will be apparent to one of ordinary skill in the art that various modifications and variations may be made from the description. For example, suitable results may be achieved if the described techniques are performed in a different order, and/or if components in a described system, architecture, device, or circuit are combined in a different manner, or replaced or supplemented by other components or their equivalents.

Therefore, other implementations, other example embodiments, and equivalents of the claims are to be construed as being included in the claims.

What is claimed is:

1. A method of manufacturing a three-dimensional (3D) flash memory including a floating device, the method comprising:

preparing a semiconductor structure including a plurality of word lines and a plurality of interlayer insulating layers that are alternately stacked in a vertical direction while each extending in a horizontal direction, at least one memory cell string that is formed extending by passing through the plurality of word lines and the plurality of interlayer insulating layers in the vertical direction, the at least one memory cell string constituting a plurality of memory cells corresponding to the plurality of word lines while including a channel layer formed extending in the vertical direction, a charge storage layer formed to surround the channel layer, and a floating device layer formed extending to surround the charge storage layer;

removing the plurality of interlayer insulating layers from the semiconductor structure; and removing regions corresponding to the plurality of interlayer insulating layers in the floating device layer to form a plurality of floating devices isolated from each other.

2. The method of claim 1, wherein the removing the regions corresponding to the plurality of interlayer insulating layers in the floating device layer comprises removing the regions corresponding to the plurality of interlayer insulating layers in the floating device layer through a plurality of air gaps that are spaces in which the plurality of interlayer insulating layers are removed.

3. The method of claim 1, wherein the removing the regions corresponding to the plurality of interlayer insulating layers in the floating device layer comprises removing the regions corresponding to the plurality of interlayer insulating layers in the floating device layer using a thermal oxidation process.

4. The method of claim 1, wherein the removing the plurality of interlayer insulating layers and the removing the regions corresponding to the plurality of interlayer insulating layers in the floating device layer is performed through a single process.

5. The method of claim 1, further comprising:

forming a floating gate oxide layer in spaces in which regions corresponding to the plurality of interlayer insulating layers in the floating device layer are removed to isolate the plurality of memory cells from each other.

* * * * *